US008976524B2

(12) United States Patent
Wang et al.

(10) Patent No.: US 8,976,524 B2
(45) Date of Patent: Mar. 10, 2015

(54) ELECTRONIC DEVICE

(71) Applicants: Tzu-Hung Wang, Taipei (TW);
Chia-Huang Chan, Taipei (TW);
Jung-Sheng Chiang, Taipei (TW)

(72) Inventors: Tzu-Hung Wang, Taipei (TW);
Chia-Huang Chan, Taipei (TW);
Jung-Sheng Chiang, Taipei (TW)

(73) Assignee: Compal Electronics, Inc., Taipei (TW)

( * ) Notice: Subject to any disclaimer, the term of this patent is extended or adjusted under 35 U.S.C. 154(b) by 191 days.

(21) Appl. No.: 13/688,218

(22) Filed: Nov. 29, 2012

(65) Prior Publication Data

US 2013/0163201 A1 Jun. 27, 2013

Related U.S. Application Data

(60) Provisional application No. 61/580,295, filed on Dec. 26, 2011.

(51) Int. Cl.
| *H05K 7/16* | (2006.01) |
| *H05K 5/02* | (2006.01) |
| *H01M 2/10* | (2006.01) |
| *B23P 11/00* | (2006.01) |
| *G06F 1/16* | (2006.01) |
| *H05K 7/20* | (2006.01) |
| *G06F 1/20* | (2006.01) |

(52) U.S. Cl.
CPC ............ *H01M 2/1066* (2013.01); *H05K 5/0213* (2013.01); *H05K 7/16* (2013.01); *B23P 11/00* (2013.01); *G06F 1/1656* (2013.01); *G06F 1/1675* (2013.01); *G06F 1/1616* (2013.01); *G06F 1/203* (2013.01)
USPC .................. 361/692; 361/679.46; 361/679.48; 361/694; 361/695; 165/80.2; 165/104.33; 165/122; 454/184

(58) Field of Classification Search
USPC ............ 361/679.01, 679.02, 679.06, 679.09, 361/679.12, 679.21, 679.28, 679.29, 361/679.33, 679.46–679.55, 690–696, 714, 361/719–727; 165/80.2, 104.33, 185, 80.3, 165/121–126; 312/223.2, 223.3, 236, 265; 174/520; 454/184; 248/188.2, 188.8, 248/616, 677, 354.7, 685, 688
See application file for complete search history.

(56) References Cited

U.S. PATENT DOCUMENTS

| 6,181,554 | B1 * | 1/2001 | Cipolla et al. ............ 361/679.46 |
| 6,437,978 | B1 * | 8/2002 | Ozaki et al. ............... 361/679.46 |
| 6,496,369 | B2 * | 12/2002 | Nakamura ..................... 361/697 |

(Continued)

FOREIGN PATENT DOCUMENTS

| TW | 200640345 | 11/2006 |
| TW | 201028829 | 8/2010 |
| TW | I352277 | 11/2011 |

OTHER PUBLICATIONS

"Office Action of Taiwan Counterpart Application", issued on May 22, 2013, p. 1-p. 10.

*Primary Examiner* — Michail V Datskovskiy
(74) *Attorney, Agent, or Firm* — Jianq Chyun IP Office

(57) ABSTRACT

An electronic device including a first body, a rotating base and a transmission module is provided. The rotating base has a first ventilation opening. The rotating base is pivoted on the first body and suitable for rotating between a using position and a retracted position in relative to the first body. When the rotating base is located at the retracted position, the first ventilation opening is exposed from the first body. When the rotating base is located at the using position, the first ventilation opening is retracted in the first body. The transmission module is connected to the rotating base for outputting a mechanical force to actuate the rotating base.

16 Claims, 7 Drawing Sheets

(56) References Cited

U.S. PATENT DOCUMENTS

| | | | |
|---|---|---|---|
| 6,515,856 B2 * | 2/2003 | Hidesawa | 361/679.48 |
| 7,447,003 B2 * | 11/2008 | Yang | 361/679.01 |
| 7,929,292 B2 * | 4/2011 | Li et al. | 361/679.46 |
| 7,961,464 B2 * | 6/2011 | Iijima | 361/695 |
| 8,014,147 B2 * | 9/2011 | Chen et al. | 361/679.56 |
| 8,218,313 B2 * | 7/2012 | Cheng et al. | 361/679.48 |
| 8,520,382 B2 * | 8/2013 | Tye et al. | 361/694 |
| 2008/0055843 A1 * | 3/2008 | Ke et al. | 361/686 |

* cited by examiner

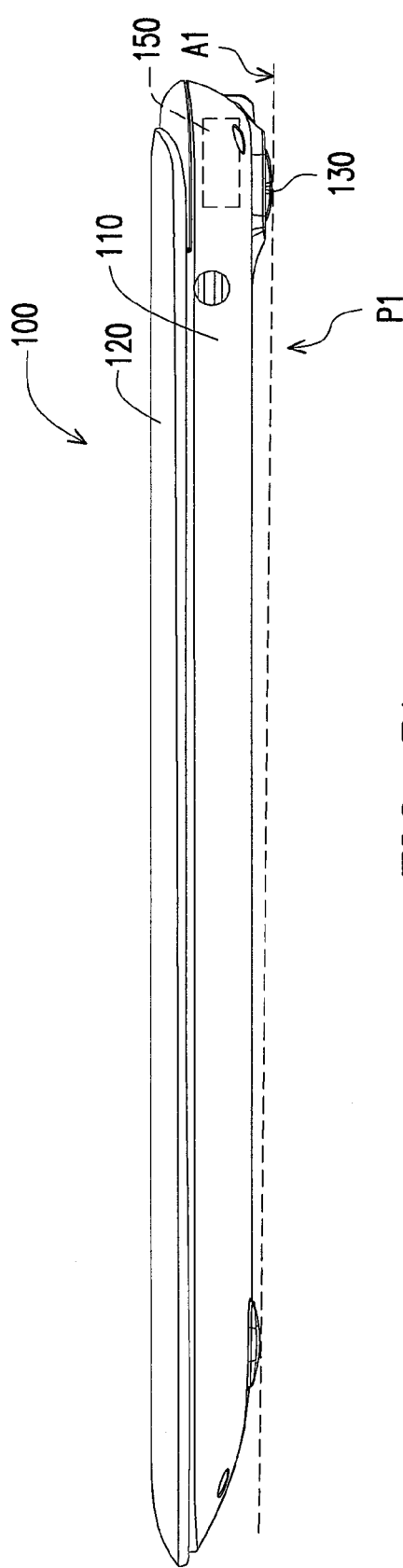
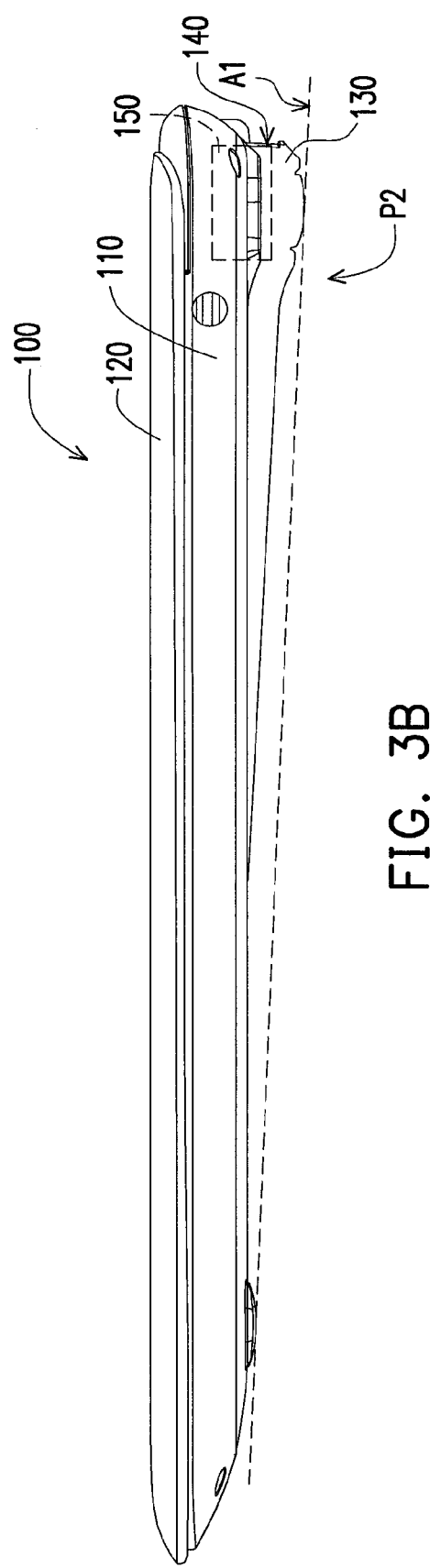
FIG. 3A
FIG. 3B

ELECTRONIC DEVICE

CROSS-REFERENCE TO RELATED APPLICATION

This application claims the priority benefit of U.S. provisional application Ser. No. 61/580,295, filed on Dec. 26, 2011. The entirety of the above-mentioned patent application is hereby incorporated by reference herein and made a part of this specification.

BACKGROUND

1. Field of the Invention

The invention relates to an electronic device, and more particularly to, an electronic device capable of hiding a connection port.

2. Description of Related Art

In recent years, following the advances of technology industry, electronic devices such as notebook computer, smart phone and tablet computer have appeared frequently in everyday life. Types and use functions of the electronic devices have become increasingly diverse, and let by the convenience and the practicality thereof, these electronic products are becoming more widely available.

Taking the notebook computer for an example, the notebook computer has a wide range of connection ports to connect with the external devices such as external hard drive, network cable, power supply, and so forth. The connection ports are usually disposed at the outside of the notebook computer, so that a user is able to connect the external devices to the connection ports conveniently. However, the connection ports disposed at the outside of the notebook computer are exposed to the external environment for a long time, and easily contaminated by dust, thus influencing the functionality of the connection ports. In addition, by disposing the connection ports at the outside of the notebook computer, visual effects of the notebook computer would be influenced.

SUMMARY OF THE INVENTION

The invention is directed to an electronic device having a hidden connection port for connecting external devices.

The invention provides an electronic device including a first body, a rotating base and a transmission module. The rotating base has a first ventilation opening. The rotating base is pivoted on the first body and suitable for rotating between a using position and a retracted position in relative to the first body. When the rotating base is located at the retracted position, the first ventilation opening is exposed from the first body. When the rotating base is located at the using position, the first ventilation opening is retracted in the first body. The transmission module is connected to the rotating base and outputs a mechanical force to actuate the rotating base.

According to the foregoing, the mechanism of the electronic device is re-designed via the transmission module in the invention, so as to actuate the rotating base, in relative to the first body, to rotate between the using position and the retracted position. When the rotating base is located at the using position, internal members (e.g., connection port) of the rotating base are exposed for use. When the rotating base is located at the retracted position, the internal members of the rotating base may be hidden to avoid the internal members of the rotating base from contaminating by dust.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 3A is a side view illustrating the electronic device of FIG. 1.

FIG. 3B is a schematic view illustrating the rotating base of FIG. 3A rotating in relative to the first body.

DETAILED DESCRIPTION OF DISCLOSED EMBODIMENTS

Figure 1:
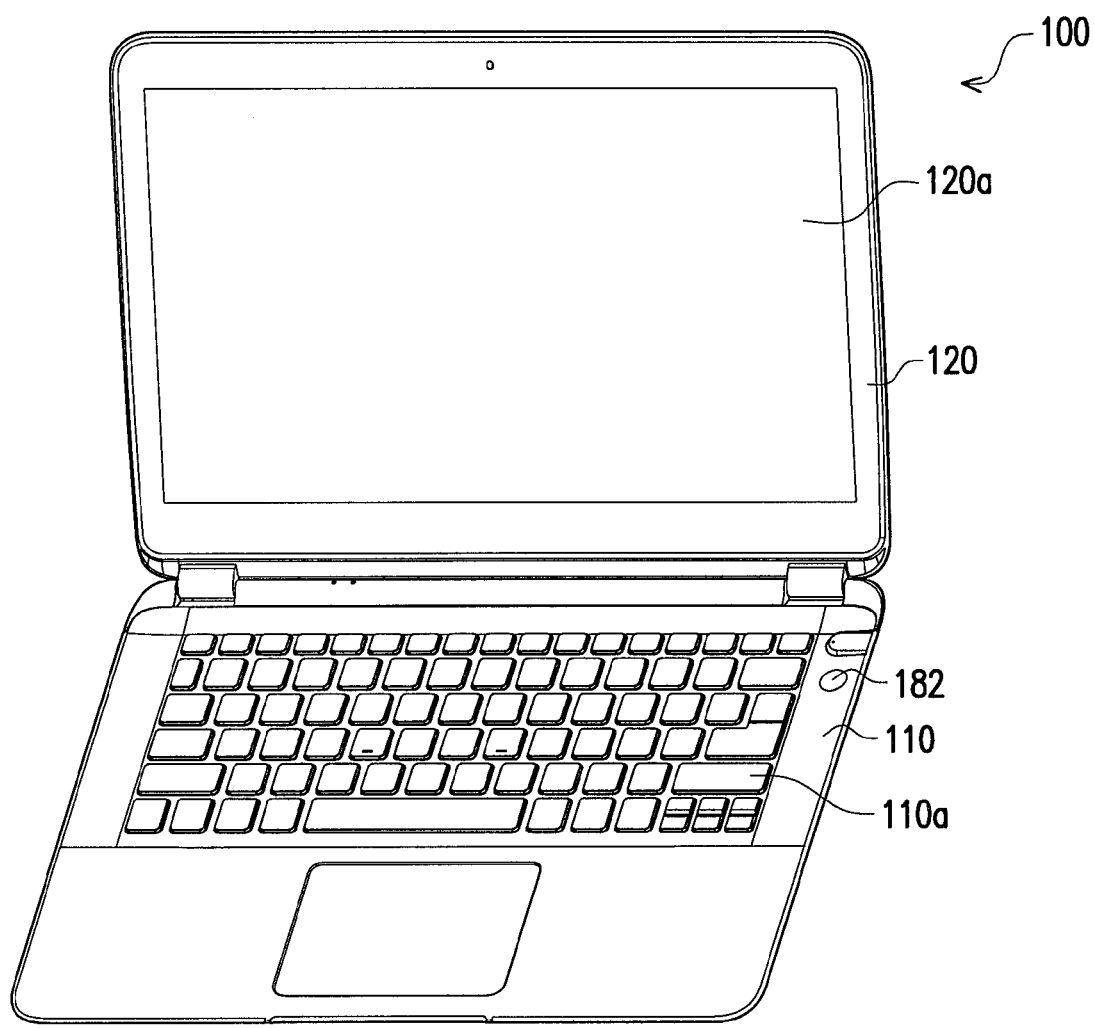
FIG. 1 is a perspective view illustrating an electronic device according to an embodiment of the invention.

FIG. 1 is a perspective view illustrating an electronic device according to an embodiment of the invention. Referring to FIG. 1, in the present embodiment, the electronic device 100 includes a first body 110 and a second body 120, wherein the second body 120 is pivoted on the first body 110. The electronic device 100 is, for example, a notebook computer integrated with an input module (first body 110) and a display module (second body 120). The first body 110 may include a keyboard 110a, and the second body 120 may include a display monitor 120a, so as to enable a user to use the electronic device 100 through the keyboard 110a and the display monitor 120a.

Figure 2:
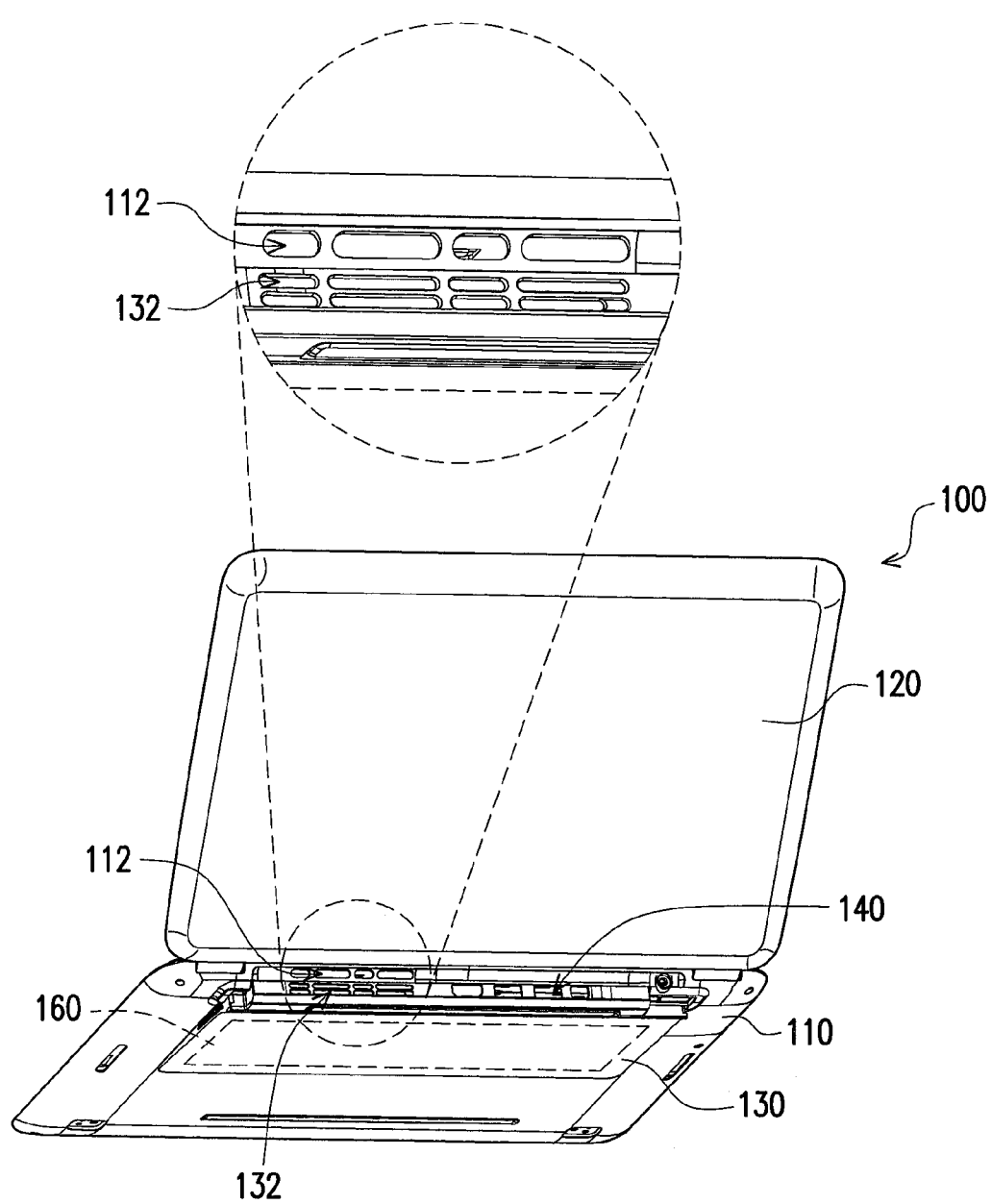
FIG. 2 is a perspective view illustrating a rotating base of the electronic device of FIG. 1 when expanded.

FIG. 2 is a perspective view illustrating a rotating base of the electronic device of FIG. 1 when expanded. FIG. 3A is a side view illustrating the electronic device of FIG. 1. FIG. 3B is a schematic view illustrating the rotating base of FIG. 3A rotating in relative to the first body. Referring to FIG. 2, FIG. 3A and FIG. 3B, the electronic device 100 further includes a rotating base 130 and a connection port 140. The rotating base 130 is pivoted on the first body 110, and the rotating base 130 is suitable for rotating, in relative to the first body 110, between a retracted position P1 (as shown in FIG. 3A) and a using position P2 (as shown in FIG. 3B). The connection port 140 is disposed on the rotating base 130. When the rotating base 130 is located at the retracted position P1, the connection port 140 is hidden within the first body 110, as shown in FIG. 3A, and when the rotating base 130 is located at the using position P2, the first body 110 exposes the connection port 140, as shown in FIG. 3B. When the user desires to use the connection port 140, the rotating base 130 may be rotated to the using position P2 in relative to the first body 110 in order to expose the connection port 140.

On the other hand, the electronic device 100 of the present embodiment may further include a motherboard 160 (as shown in FIG. 2) disposed at the rotating base 130, and the motherboard 160 is connected to the connection port 140. In other embodiments, the electronic device 100 also utilizes other types of electronic components to connect to the connection port 140; the invention is not limited thereto. Now, the user may connect an external electronic device to the connection port 140, so that signals may be transmitted between the external electronic device and the motherboard 160. When the user does not use the connection port 140, the rotating base 130 may be rotated to the retracted position P1 in relative to the first body 110, and thus the connection port 140 and the motherboard 160 are hid within the first body 110, so as to avoid the connection port 140 and the motherboard 160 from being contaminated by dust and influence an efficacy of the electronic device 100.

Figure 8:
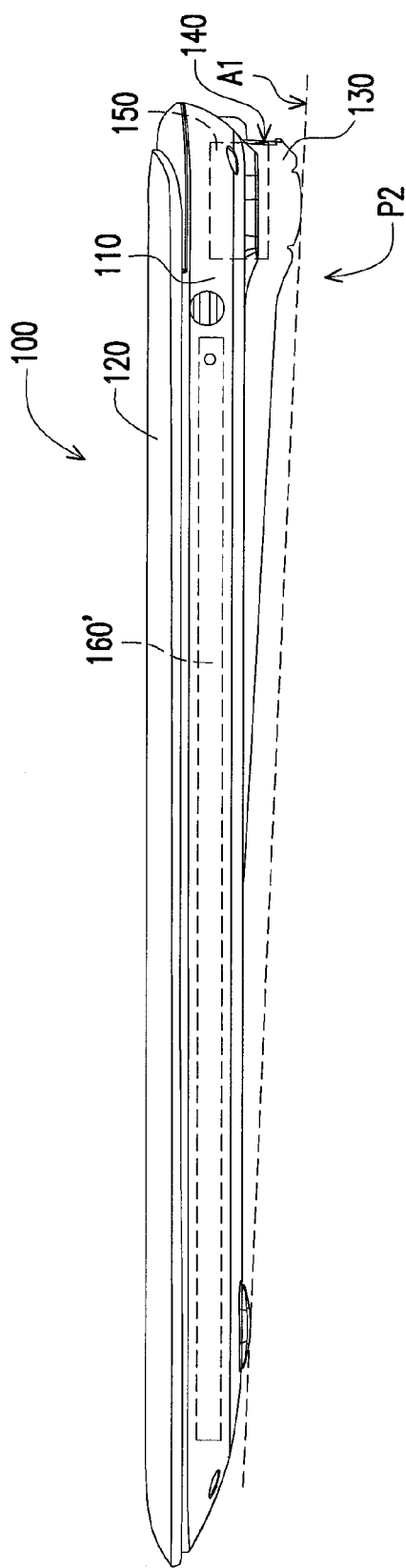
FIG. 8 is a schematic view illustrating the rotating base of FIG. 3B rotating in relative to the first body according to another embodiment.

FIG. 8 is a schematic view illustrating the rotating base of FIG. 3B rotating in relative to the first body according to another embodiment. Other than disposing the motherboard 160 at the rotating base 130, as shown in FIG. 2, a motherboard 160' may also be disposed at the first body 110; as shown in FIG. 8. Now, the connection port 140, which is electrically connected to the motherboard 160' through a flexible printed circuit board (not shown), may also enable an external electronic device and the motherboard 160' to transmit signals with each other through the connection port 140.

In the present embodiment, the rotating base 130 has a first ventilation opening 132, and the first body 110 has a second ventilation opening 112. When the electronic device 100 is operating, airflows generated by the internal components of the electronic device 100 flow out of the electronic device 100 through the first ventilation opening 132 and the second ventilation opening 112 for assisting the electronic device 100 to dissipate heat.

Figure 4A:
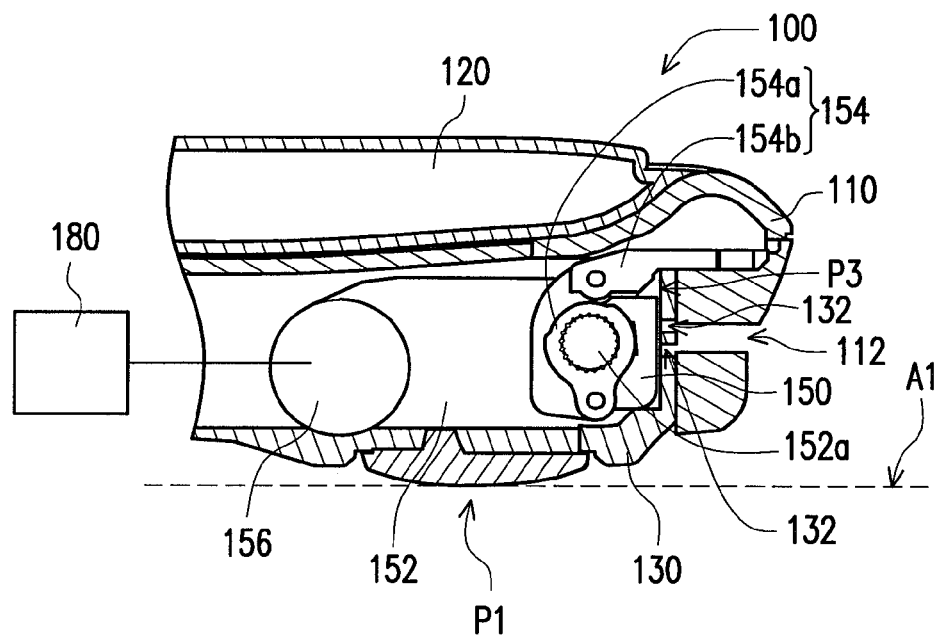
FIG. 4A is a partial cross-sectional view illustrating the electronic device of FIG. 3A.

Specifically, when the rotating base 130 is located at the retracted position P1, the first ventilation opening 132 is retracted in the first body 110, wherein the first ventilation opening 132 is located at a side of the second ventilation opening 112 and along side with the second ventilation opening 112 (illustrated in FIG. 4A). Therefore, the airflows within the electronic device 100 are firstly flow out of the rotating base 130 through the first ventilation opening 132, and then flow out of the first body 110 the through the second ventilation opening 112. With this, the rotating base 130, even if is retracted in the first body 110, is unable to adversely affect the heat dissipation efficiency of the first body 110.

Relatively, when the rotating base 130 is located at the using position P2, the first ventilation opening 132 following the rotation of the rotating base 130 is exposed from the first body 110, so that the first ventilation opening 132 and the second ventilation opening 112 are appeared to be in an upper and lower disposition. Therefore, the airflows within the electronic device 100 may respectively flow out of the electronic device 100 through the first ventilation opening 132 and the second ventilation opening 112, as shown in FIG. 2. Accordingly, when the rotating base 130 is located at the using position P2, a ventilation area of the electronic device 100 is increased so as to enhance the heat dissipation efficiency of the electronic device 100. In addition, as shown in FIG. 3A, the first body 110 is suitable to be disposed at a flat surface A1 for the user to operate. The flat surface A1 is, for example, desktop or other flat surface capable of placing the first body 110. When the rotating base 130 is rotated from the retracted position P1 shown in FIG. 3A to the using position P2 shown in FIG. 3B, the rotating base 130 prop up the first body 110 from the flat surface A1, so as to enable the electronic device 100 to have a favorable angle of use.

Figure 4B:
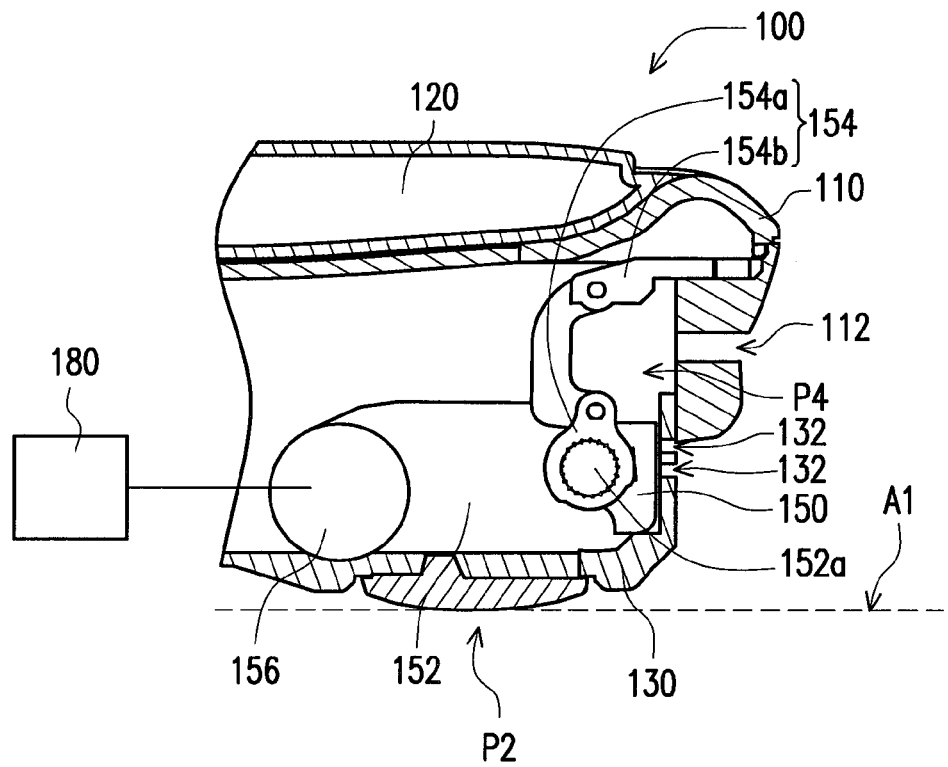
FIG. 4B is a partial cross-sectional view illustrating the electronic device of FIG. 3B.

FIG. 4A is a partial cross-sectional view illustrating the electronic device of FIG. 3A. FIG. 4B is a partial cross-sectional view illustrating the electronic device of FIG. 3B. Referring to FIG. 4A and FIG. 4B, the electronic device 100 further includes a transmission module 150 and a control module 180. The transmission module 150 is located between the first body 110 and the rotating base 130, and is connect to the rotating base 130. The control module 180 is electrically connected with the transmission module 150. The control module 180 outputs a control signal to drive the transmission module 150 to actuate the rotating base 130. The rotating base 130 in the present embodiment is rotated between the retracted position P1 and the using position P2 in relate to the first body 110 via actuating the transmission module 150. With this, the control module 180 can control the location of the rotating base 130 according to the operating states of the electronic device 100.

Specifically, the control module 180 has a control button 182 (illustrated in FIG. 1). The control button 182 is disposed at the first body 110, and the control button 182 is provided for the user to push to trigger the actuation of the rotating base 130. Therefore, when the user pushes the control button 182, the control module 180 transmits the control signal to the transmission module 150. The transmission module 150 is configured to control the position of rotating base 130 according to the control signal from the control module 180. In other embodiments, the transmission module 150 outputs the control signal via a software determination. For example, when the electronic device 100 is under a booting mode, the user may enable the control module 180 to generate the control signal through a user operation interface, so as to drive the transmission module 150 to actuate the rotating base 130. Or, the control module 180 may be preset the states of the rotating base 130 corresponding to the electronic device under different operation modes, so as to generate the control signal for driving the transmission module 150 to actuate the rotating base 130.

In the present embodiment, the transmission module 130 outputs a mechanical force to actuate the rotating base 130. In detail, the transmission module 150 includes a gearbox 152, a linkage 154 and a driving motor 156, wherein the mechanical force output by the transmission module 150 is generated by the rotation of the driving motor 156. The gearbox 152 has an output shaft 152a. The linkage 154 is connected to the output shaft 152a. The driving motor 156 is coupled to the output shaft 152a, so as to drive the linkage 154, in relative to the gearbox 152, to rotate between a closed position P3 and an open position P4. When the linkage 154 is located at the closed position P3, the linkage 154 rotates the rotating base 130, in relative to the first body 110, to the retracted position P1 shown in FIG. 3A.

Next, the driving motor 156 drives the output shaft 152a to enable the linkage 154 to rotate from the closed position P3 shown in FIG. 4A to the open position P4 shown in FIG. 4B, so that the rotating base 130, in relative to the first body 110, is rotated from the retracted position P1 to the using position P2 shown in FIG. 3B. Moreover, the linkage 154, in addition to rotate the rotating base 130 to the using position P2, may also provide a support force for the rotating base 130 to prop up the first body 110 from the flat surface A1, so that the electronic device 100 has a favorable use angle.

Figure 5:
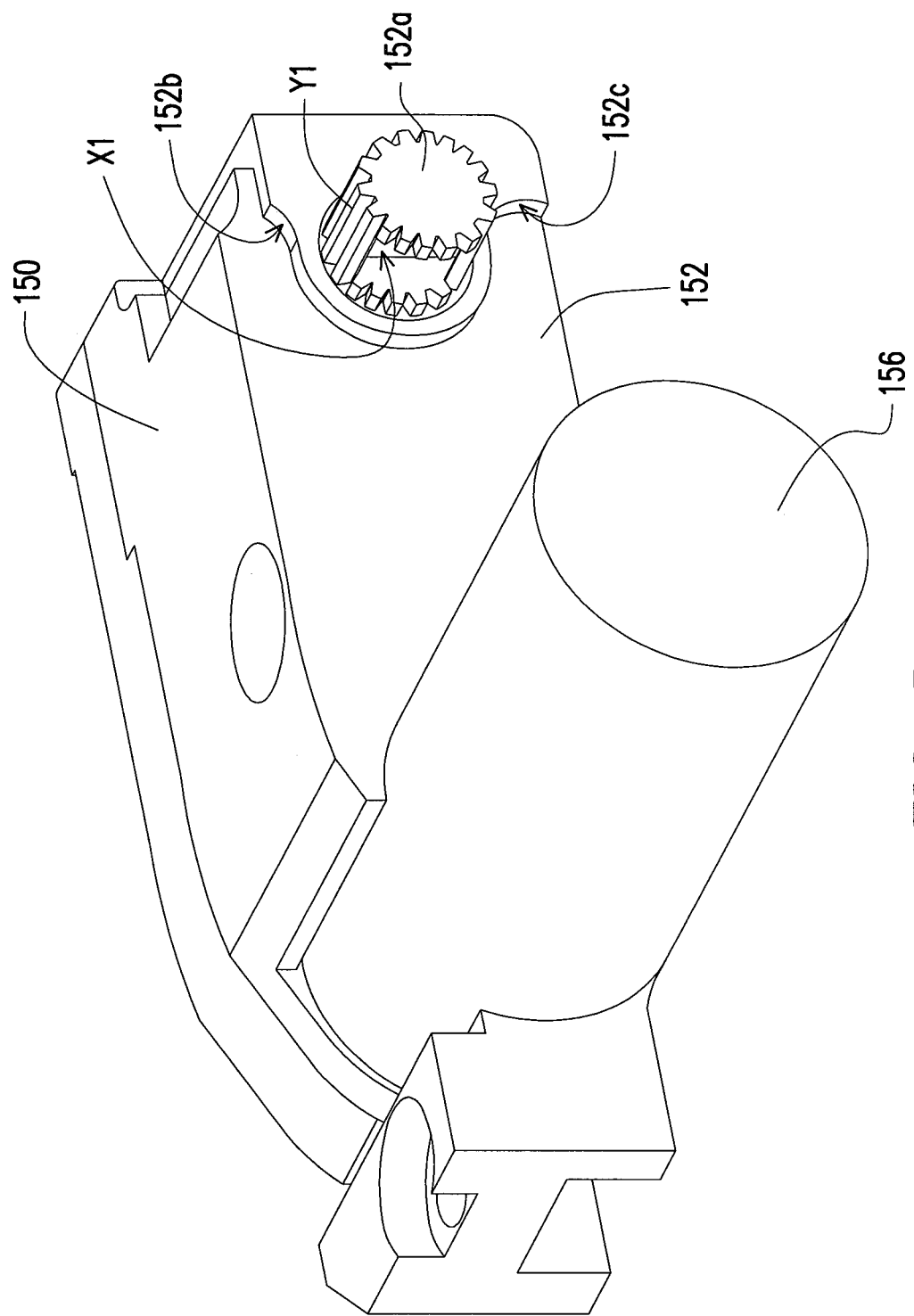
FIG. 5 is a schematic view illustrating the gearbox and the driving motor of FIG. 4A.
Figure 6:
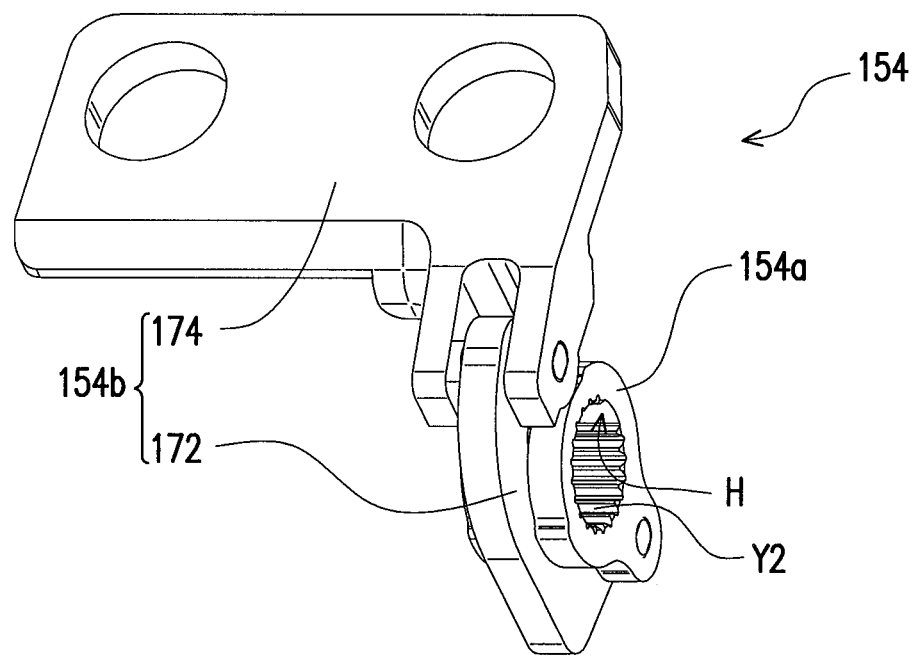
FIG. 6 is a schematic view illustrating the linkage of FIG. 4A.

FIG. 5 is a schematic view illustrating the gearbox and the driving motor of FIG. 4A. FIG. 6 is the schematic view illustrating a linkage of FIG. 4A. Referring to FIG. 5 and FIG.

6, in the present embodiment, the linkage 154 includes a driving arm 154a and a driven arm 154b. The driven arm 154b is pivoted on the driving arm 154a to rotate between the open position P4 (as shown in FIG. 4B) and the closed position P3 (as shown in FIG. 4A) in relative to the gearbox 152. In addition, the driven arm 154b of the present embodiment includes a pivoted portion 172 and a connecting portion 174. The pivoted portion 172 is pivoted on the connecting portion 174. The driven arm 154b is pivoted on the driving arm 154a through the pivoted portion 172, and the connecting portion 174 is fixed disposed at the first body 110. The following describes an actuation means between the driving arm 154a, the driven arm 154b and the gearbox 152.

The gearbox 152 has an open stop point 152b and a close stop point 152c. When the driven arm 154b, in relative to the gearbox 152, is rotated from the closed position P3 to the open position P4, the driving arm 154b is blocked by the open stop point 152b to ensure that the driven arm 154b, in relative to the gearbox 152, is located at the open position P4 (as shown in FIG. 4B), and this may prevent the rotating base 130 from being damaged by rotating the rotating base 130, in relative to the first body 110, over the using position P2. In other embodiments, the gearbox 152 may block the driving arm 154a via other suitable means; the invention is not limited thereto.

On the other hand, when the driven arm 154b, in relative to the gearbox 152, is rotated from the open position P4 to the closed position P3, the driving arm 154b is blocked by the close stop point 152c to ensure that the driven arm 154b, in relative to the gearbox 152, is located at the closed position P3 (as shown in FIG. 4A), and this may prevent the rotating base 130 from being damaged during the retraction by rotating the rotating base 130, in relative to the first body 110, over the retracted position P1.

In addition, a material of the driving arm 154b in the present embodiment is a flexible material. Therefore, the driving arm 154b has flexibility and may be reinstated, due to having the flexibility, after being subjected to an external force. Accordingly, the driving arm 154b may be reinstated after blocked by the open stop point 152b or the close stop point 152c, so as to avoid the driving arm 154b from contacting the open stop point 152b or the close stop point 152c, and causing the driving arm 154b to be worn or damaged.

Figure 7:
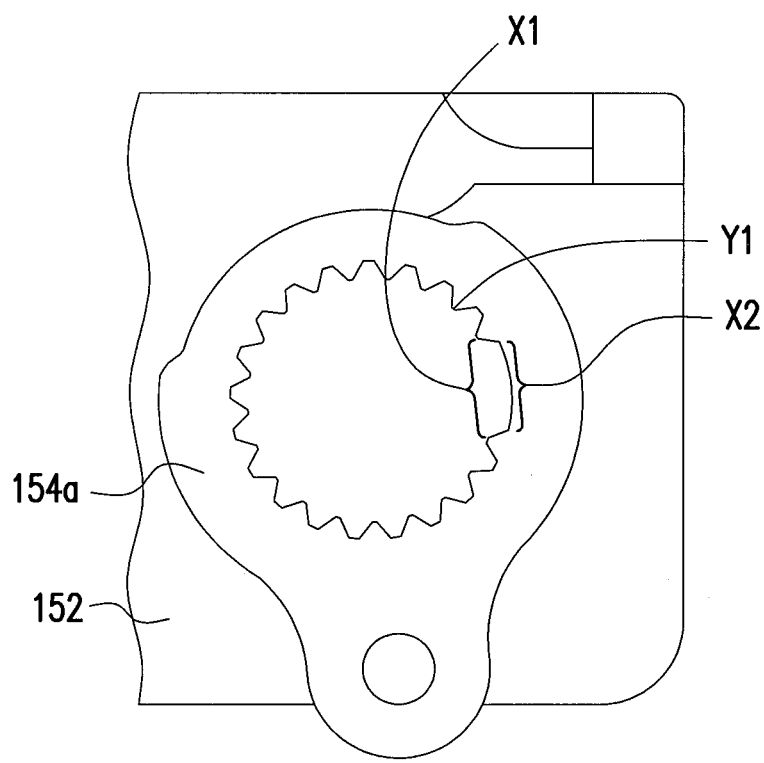
FIG. 7 is a schematic view illustrating the driving arm of FIG. 5 assembled to the output shaft.

FIG. 7 is a schematic view illustrating the driving arm of FIG. 5 assembled to the output shaft. Referring to FIG. 5 to FIG. 7, in the present embodiment, the driving arm 154a has a drive shaft hole H, and the output shaft 152a is fit with the drive shaft hole H. In detail, the output shaft 152a has a plurality of outer engaging portions Y1, the drive shaft hole H has a plurality of inner engaging portions Y2, and the inner engaging portions Y2 are engaged to the outer engaging portions Y1. In the present embodiment, the output shaft 152a and the drive shaft hole H may possess a foolproof function via a special appearance design. For example, the output shaft 152a further includes an outer flat portion X1, the drive shaft hole H further includes an inner flat portion X2, and a location of the outer flat portion X1 is corresponding to a location of the inner flat portion X2, so as to ensure that the inner engaging portions Y2 are engaged to the outer engaging portions Y1.

In summary, the mechanism of the electronic device is re-designed via the transmission module in the invention, so as to actuate the rotating base, in relative to the first body, to rotate between the using position and the retracted position. When the rotating base is located at the using position, internal members (e.g., connection port) of the rotating base are exposed for use. When the rotating base is located at the retracted position, the internal members of the rotating base may be hidden to avoid the internal members of the rotating base from contaminating by dust. In addition, the first body of the electronic device may be propped up on the flat surface (e.g., a desktop) by the rotating base via the rotation of the rotating base, so as to facilitate an adjustment of the use angle of the electronic device.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. An electronic device comprising:
a first body;
a rotating base having a first ventilation opening, the rotating base pivoted on the first body and suitable for rotating between a using position and a retracted position in relative to the first body, wherein when the rotating base is located at the using position, the first ventilation opening is exposed from the first body, and when the rotating base is located at the retracted position, the first ventilation opening is retracted in the first body; and
a transmission module connected to the rotating base, and outputting a mechanical force to actuate the rotating base, wherein the transmission module further comprises:
a gearbox having an output shaft;
a linkage connected to the output shaft, wherein the linkage comprises a driving arm and a driven arm, the driving arm has a drive shaft hole and the output shaft fit with the drive shaft hole, the driven arm is pivoted on the driving arm to rotate between the open position and the closed position in relative to the gearbox; and
a driving motor coupled to the output shaft to drive the linkage, in relative to the gearbox, to rotate between an open position and a closed position, wherein when the linkage is located at the closed position, the linkage rotates the rotating base, in relative to the first body, to the retracted position, and the output shaft is driven by the driving motor to enable the linkage to rotate from the closed position to the open position, so that the rotating base, in relative to the first body, is able to rotate from the retracted position to the using position.

2. The electronic device as recited in claim 1, wherein the first body has a second ventilation opening, and when the rotating base is located at the retracted position, the first ventilation opening is located at a side of the second ventilation opening.

3. The electronic device as recited in claim 1 further comprising:
a connection port disposed on the rotating base, when the rotating base is located in the retracted position, the connection port is hidden within the first body, and when the rotating base is located at the using position, the first body exposes the connection port.

4. The electronic device as recited in claim 1 further comprising:
a motherboard disposed at the first body or the rotating base.

5. The electronic device as recited in claim 1, wherein the first body is suitable to be disposed in a flat surface, and when the rotating base is located at the using position, the rotating base props up the first body from the flat surface.

6. The electronic device as recited in claim 1, wherein the driven arm comprises a pivoted portion and a connecting portion, and the pivoted portion is pivoted on the connecting portion.

7. The electronic device as recited in claim 1, wherein the gearbox has an open stop point and a close stop point, when the driven arm, in relative to the gearbox, is rotated from the open position to the closed position, the driving arm is blocked by the close stop point to ensure that the driven arm, in relative to the gearbox, is located in the closed position, and when the driven arm is rotated from the closed position to the opening position in relative to the gearbox, the driving arm is blocked by the open stop point to ensure that the driven arm, in relative to the gearbox, is located in the open position.

8. The electronic device as recited in claim 1, wherein the output shaft has a plurality of outer engaging portions, the drive shaft hole has a plurality of inner engaging portions, and the inner engaging portions are engaged to the outer engaging portions.

9. The electronic device as recited in claim 8, wherein the output shaft further comprises an outer flat portion, the drive shaft hole further comprises an inner flat portion, and a location of the outer flat portion is corresponded to a location of the inner flat portion so as to ensure that the inner engaging portions are engaged to the outer engaging portions.

10. The electronic device as recited in claim 1 further comprising:
a second body pivoted on the first body.

11. The electronic device as recited in claim 1 further comprising:
a control module electrically connected to the transmission module, the control module outputting a control signal to drive the transmission module to actuate the rotating base.

12. The electronic device as recited in claim 11, wherein the control module has a control button disposed at the first body.

13. The electronic device as recited in claim 11 further comprising:
a user operation interface enabling the control module to generate the control signal.

14. The electronic device as recited in claim 11, wherein the control module generates the control signal according to an operation mode of the electronic device.

15. The electronic device as recited in claim 1, wherein the transmission module is located between the first body and the rotating base.

16. The electronic device as recited in claim 1, wherein the mechanical force output by the transmission module is generated from a rotary motion of a driving motor.

* * * * *